United States Patent [19]

Inuzuka et al.

[11] Patent Number: 5,777,946
[45] Date of Patent: Jul. 7, 1998

[54] SEMICONDUCTOR MEMORY CIRCUIT EQUIPPED WITH A COLUMN ADDRESSING CIRCUIT HAVING A SHIFT REGISTER

[75] Inventors: Kazuko Inuzuka, Tokyo; Shigeo Ohshima, Yokohama; Katsushi Nagaba, Kawasaki, all of Japan

[73] Assignee: Kabushiki Kaisha Toshiba, Tokyo, Japan

[21] Appl. No.: 770,404

[22] Filed: Dec. 20, 1996

[30] Foreign Application Priority Data

Dec. 25, 1995 [JP] Japan ................. 7-337279

[51] Int. Cl.⁶ .................................................. G11C 8/04
[52] U.S. Cl. .................. 365/240; 365/233; 365/230.06; 365/189.12
[58] Field of Search ................. 365/233, 230.06, 365/240, 189.12

[56] References Cited

U.S. PATENT DOCUMENTS

5,448,528  9/1995  Nagai ................................. 365/233
5,598,376  1/1997  Merritt et al. ................. 365/230.06

Primary Examiner—David C. Nelms
Assistant Examiner—Andrew Q. Tran
Attorney, Agent, or Firm—Loeb & Loeb LLP

[57] ABSTRACT

The present invention provides a semiconductor memory circuit capable of high-speed access to a predetermined column portion by a simplified high-speed addressing circuit. The memory circuit in a DRAM is such that a portion of a column addressing circuit normally comprising a counter constitutes a shift register in a column addressing circuit at a preceding stage of a column address buffer so that a plurality of address signal wrappings are realized for accessing the predetermined column portion.

17 Claims, 10 Drawing Sheets

SEMICONDUCTOR MEMORY CIRCUIT EQUIPPED WITH A COLUMN ADDRESSING CIRCUIT HAVING A SHIFT REGISTER

BACKGROUND OF THE INVENTION

The present invention relates to memory access and, in particular, to a semiconductor memory circuit having an addressing system for allowing access to a predetermined column portion through the wrapping of an address signal in synchronism with a clock.

It has been known that, in synchronism with a clock signal, burst access is gained to a memory cell array for data write/read in a synchronous DRAM. In order to perform a burst operation, the synchronous DRAM is equipped with a counter configuration type addressing circuit.

Figure 1:
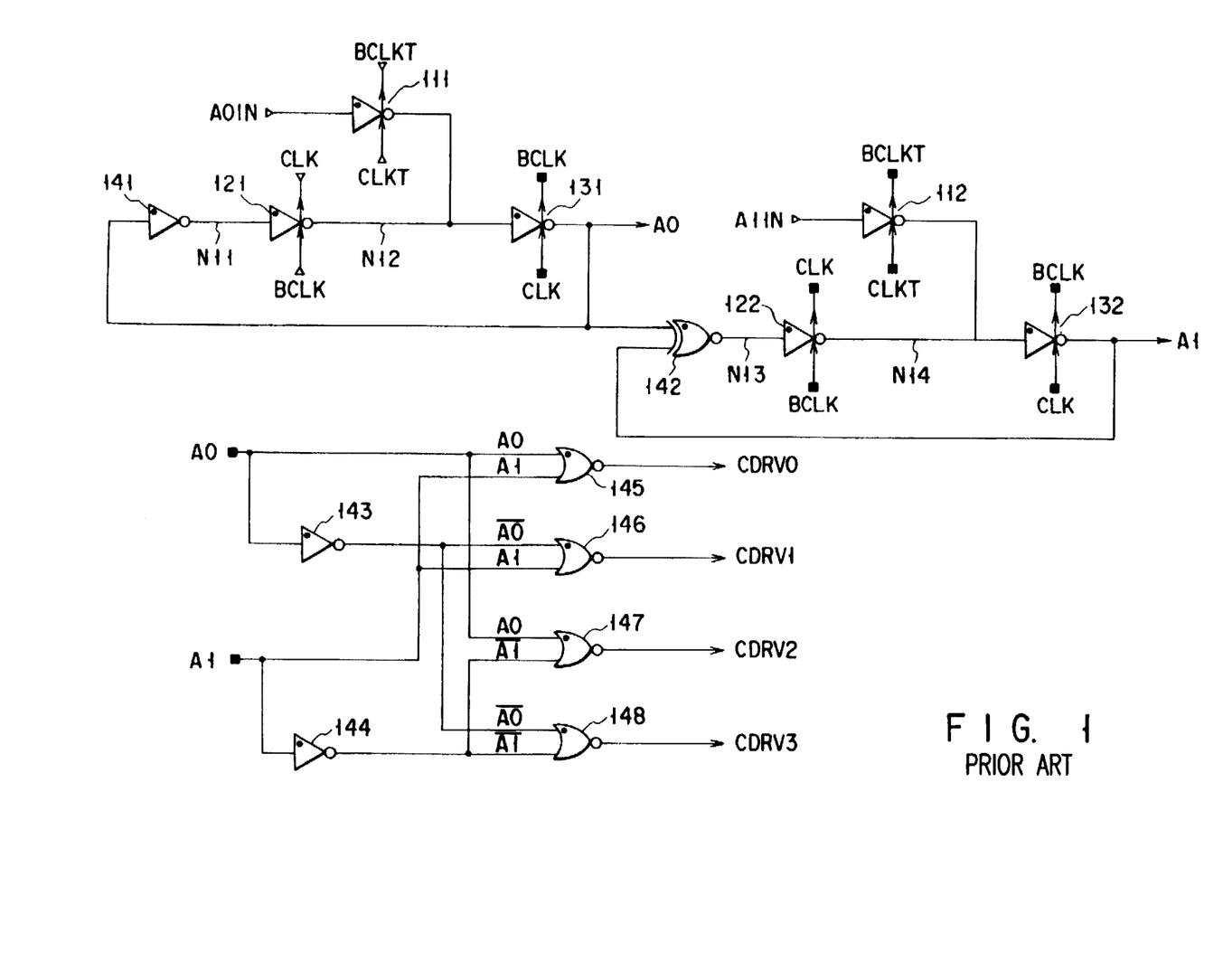
FIG. 1 is a circuit arrangement showing a main section of a conventional addressing circuit (a section of an addressing circuit relating to burst access) using a counter.
Figure 2:
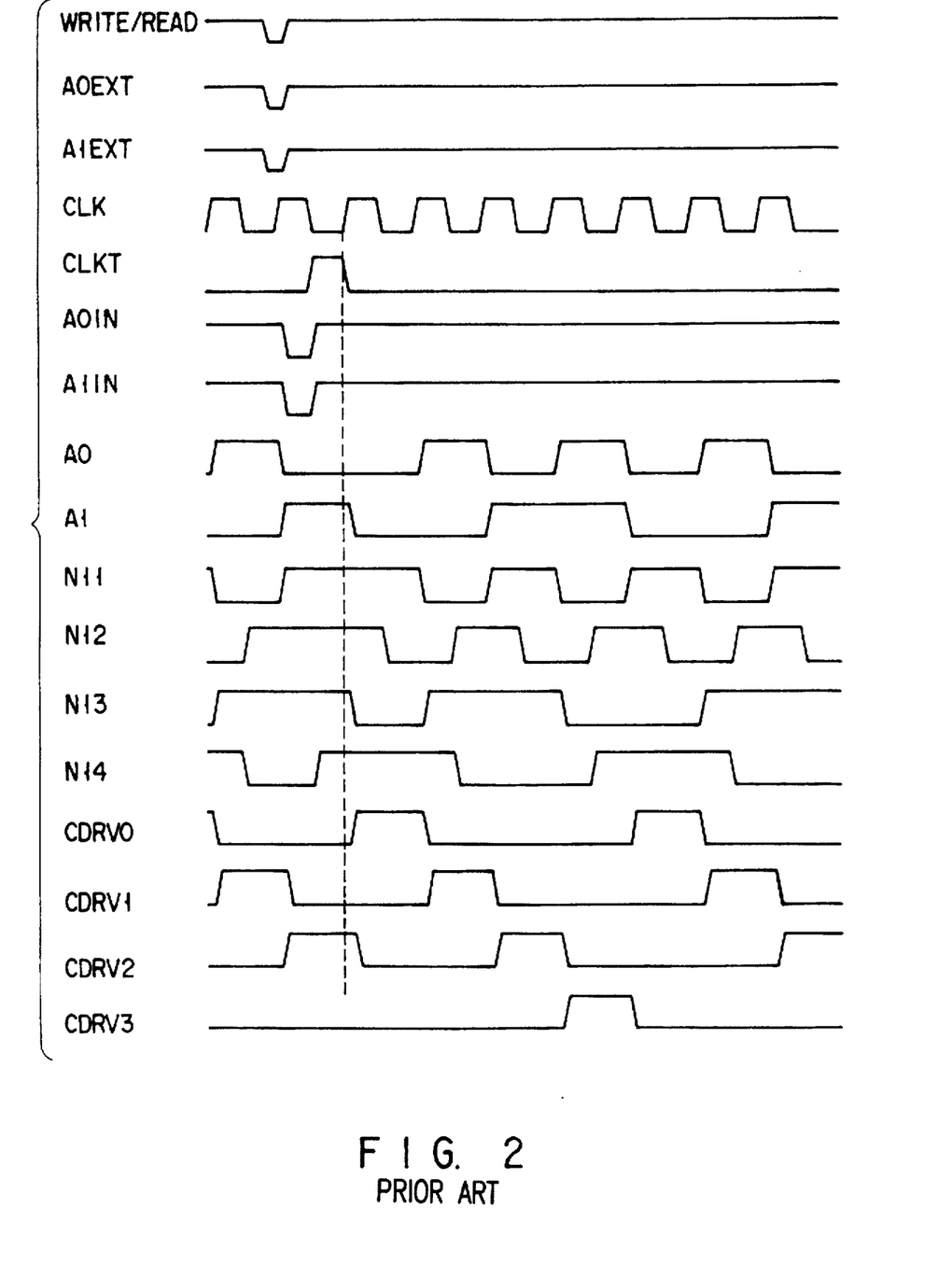
FIG. 2 is an operation waveform diagram for explaining a circuit operation in FIG. 1.

FIG. 1 shows a circuit diagram showing a major section of a conventional addressing circuit (part of the addressing circuit relating to burst access) and FIG. 2 shows an operation waveform diagram of the circuit of FIG. 1. In order to start a burst operation, the synchronous DRAM receives, together with a write/read command signal, head column signals (tap address signals: A0EXT, A1EXT). A signal A0IN is an internal address signal corresponding to the tap address signal A0EXT and a signal A1IN an internal address signal corresponding to the tap address signal A1EXT. Clocked inverters 111 and 112 become active upon receipt of clock signals CLK and CLKT, respectively, which rise and fall from the fall and rise states at the next time after a write/read command signal is received. Clocked inverters 131 and 132 become active upon receipt of a "H" level of a clock signal CLK. Clocked inverters 121 and 122 become active upon receipt of a clock signal BCLK (an inverted replica of CLK). The clocked inverters 121 and 122 are adapted to be internally controlled such that they become inactive, irrespective of the signal BCLK, upon receipt of a signal CLKT pulse.

An addressing signal A0, that is, the output, of the clocked inverter 131 is connected to the input of an inverter 141 and to one input of an EXOR gate 142. The output (node N11) of the inverter 141 is connected to the input of the clocked inverter 121 and the output of the inverter 121 is connected to the input (node N12) of the clocked inverter 131. The output of the clocked inverter 111 supplied with the signal A0IN is connected to the node N12. An addressing signal A1, that of, the output, of a clocked inverter 132 is connected to the other input of the EXOR gate 142. The output (node N13) of the EXOR gate 142 is connected to the input of the clock inverter 122. The output of the inverter 122 is connected to the input (node N14) of the clocked inverter 132. The output of the clocked inverter 112 supplied with a signal A1IN is connected to a node N14.

Four combination signals, that is, the addressing signals A0, A1 and their inverted signals of inverters 143 and 144 are output as column drive signals CDRV0 to CDRV3 via NOR gates 145 to 148 to drive corresponding column select lines.

The operation of the FIG. 1 circuit will be explained with reference to FIG. 2. When the tap address signals A0EXT and A1EXT, together with the write/read command signal, are input to the addressing circuit, the clocked inverters 111 and 112 become active by the signal CLKT and the clocked inverters 121 and 122 become inactive. The nodes N12 and N14 are set to initial values in accordance with the internal address signals A0IN and A1IN generated in a way to correspond to the tap address signals A0EXT and A1EXT. Then the clocked inverters 131 and 132 become active upon receipt of a first clock CLK to output the signals A0 and A1. As a result, corresponding pulses are generated as the column drive signals CDRV0 to CDRV3. Thereafter, the addressing signals A0 and A1 are counted up for each clock pulse CLK.

Figure 5:
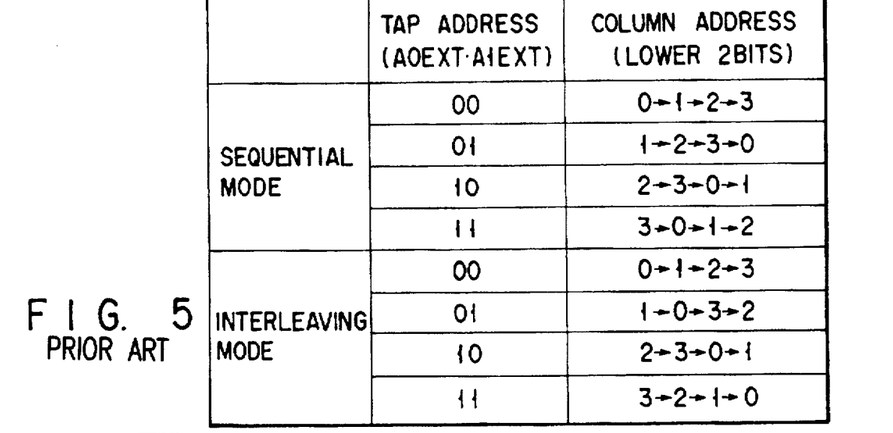
FIG. 5 is a view showing the column addressing of the synchronous DRAM.

In the synchronous DRAM, the addressing of a given column portion is made, for example, as shown in FIG. 5. The column address is not carried as, for example, "2-3-4-5" and is wrapped as "2-3-0-1". The address select mode includes not only a sequential mode but also an interleaving mode.

Figure 3:
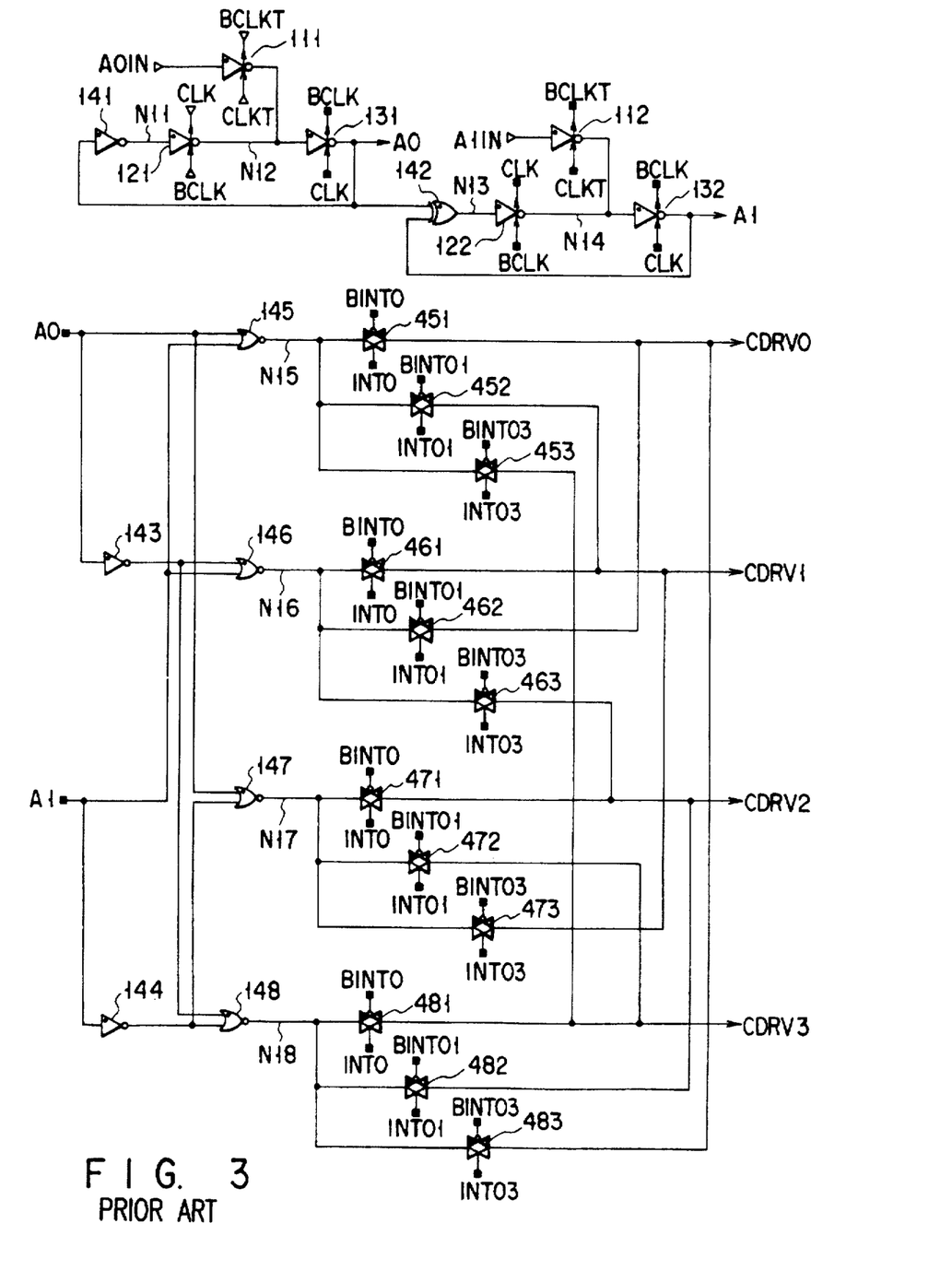
FIG. 3 is a circuit diagram showing a main section of a conventional addressing circuit using a counter in a synchronous DRAM.

In the interleaving mode, the addressing circuit using a counter in the synchronous DRAM is as shown in FIG. 3, taking into consideration the case where, at A0IN=1, the address is decremented. That is, the outputs of NOR gates 145 to 148 as in FIG. 1 are connected to predetermined column drive signals CDRV0 to CDRV3, respectively, through transfer gates (451, 461, 471 and 481), controlled with signals INT0 and BINT0, transfer gates (452, 462, 472 and 482) controlled with signals INT01 and BINT01 and transfer gates (453, 463, 473 and 483) controlled with signals INT03 and BINT03. It is to be noted that the head letter "B" in the respective signal pair to the respective transfer gate is intended to mean an inverted signal. The respective transfer gate is turned ON with the control signal INT0 (INT01 or INT03) at a "H" level (BINT0 (BINT01 or BINT03) at a "L" level) and turned OFF in a reverse signal relation.

Figure 4:
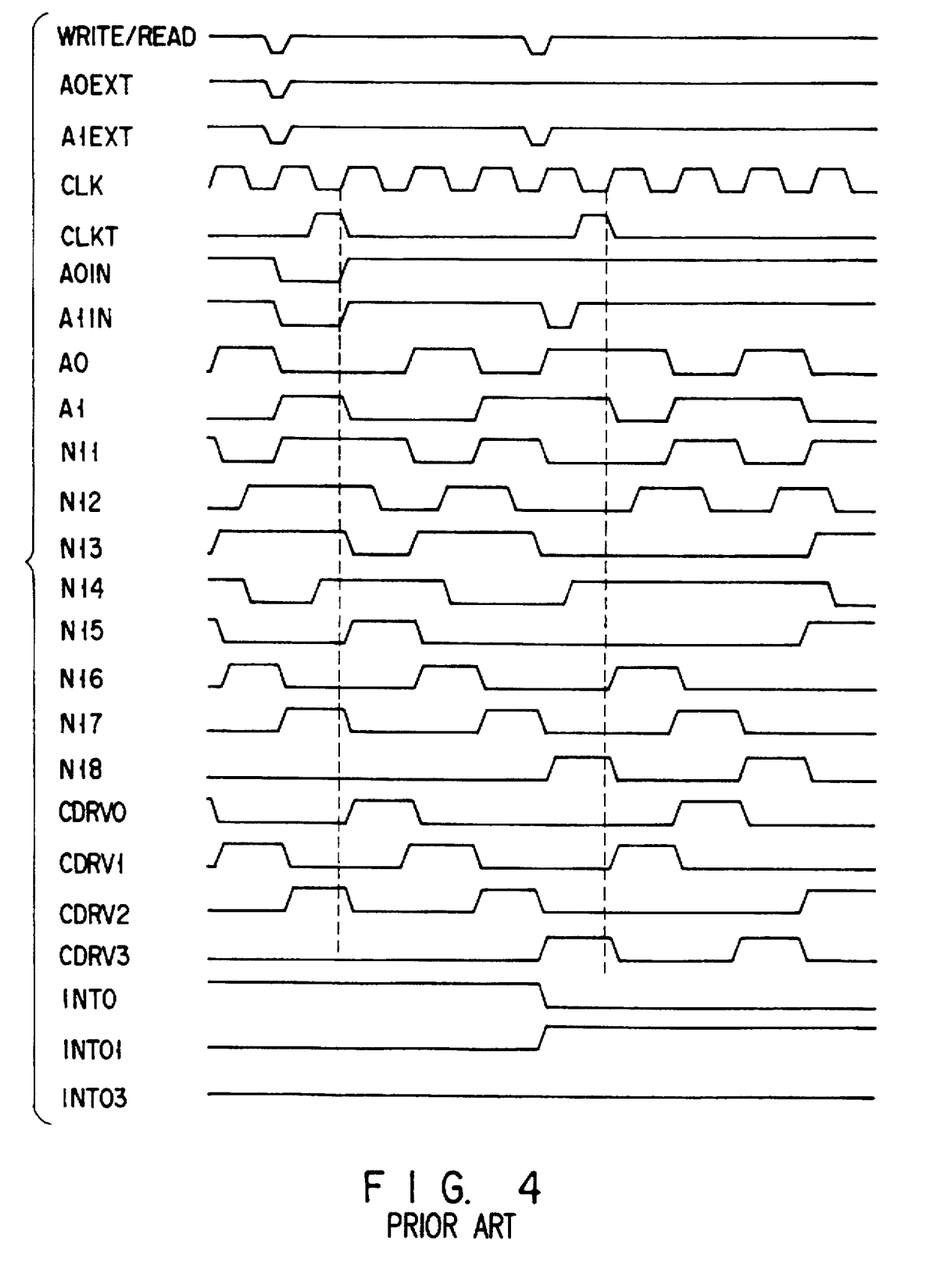
FIG. 4 is an operation waveform diagram for explaining an interleaving mode in FIG. 3.

FIG. 4 shows an operation waveform diagram for explaining the interleaving mode in FIG. 3. After the count-up operation of the counter, the data path of the column drive signals CDRV0 to CDRV3, that is, the control signals (INT0, INT01, INT03) to the transfer gates, are switched in accordance with the addressing mode and tap address signal.

In the interleaving mode, at A0IN=1 the INT0-controlled transfer gates 451, 461, 471 and 481 are turned OFF. If, at this time, A1IN=0, the INT01-controlled transfer gates 452, 462, 472 and 482 are turned ON and the "H" level pulse generation sequence of the respective column drive signals is CDRV (1→0→3→2). If A1IN=1, the INT03-controlled transfer gates 453, 463, 473 and 483 are turned ON and the pulse generation sequence of the respective column drive signals is CDRV (3→2→1→0). In the case other than the above-mentioned cases, the INT0-controlled transfer gates 451, 461, 471 and 481 are turned ON and the addressing is the same as in the circuit operation of FIG. 1.

Since, after the count-up operation of the address signals, the respective column drive signals CDRV0 to CDRV3 corresponding to the address signals are generated in the above-mentioned arrangement, problems arise as will be set out below. First, more control signals are required to make an associated circuit complex in arrangement. Second, a greater delay time is involved from the clock signal CLK to the column drive signals CDRV0 to CDRV3. Third, since the addressing signals A0 and A1 are handled at an ordinary binary counter circuit, an automatic carry is effected to an upper bit position and it becomes necessary to provide an additional circuit, in an address signal wrapping system as in a synchronous DRAM, which involves no such carry to the upper bit position. Thus, the column addressing circuit in the conventional memory circuit operates such a circuit that, after the address signals have been counted up with a binary counter circuit, corresponding column drive signals CDRV0 to CDRV3 are generated. Thus, the circuit arrangement needs more control signals, involves a greater delay and becomes more complex.

BRIEF SUMMARY OF THE INVENTION

It is accordingly the object of the present invention to provide a semiconductor memory circuit which can be given high-speed access to a predetermined column portion of a memory cell array through the utilization of a simplified high-speed addressing circuit.

According to the present invention there is provided a memory circuit having an address select mode and adapted to access a predetermined column portion, characterized by comprising:

a memory cell array having a plurality of memory cells;

means for designating an address signal corresponding to a head address for accessing a predetermined column portion of the memory cell array in synchronism with a clock signal from an outside; and internal address signal generating means including a shift register for allowing access to the predetermined column portion in a corresponding address select mode from an address in synchronism with the clock signal.

According to the present invention, address wrappings are realized on a simplified circuit of less delay through a shift register arrangement. Further, the shift register arrangement can be constructed as a simplified practical array shiftable in any of forward and reverse directions, thus contributing to setting the wrapping of address signals in a corresponding address select mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 6:
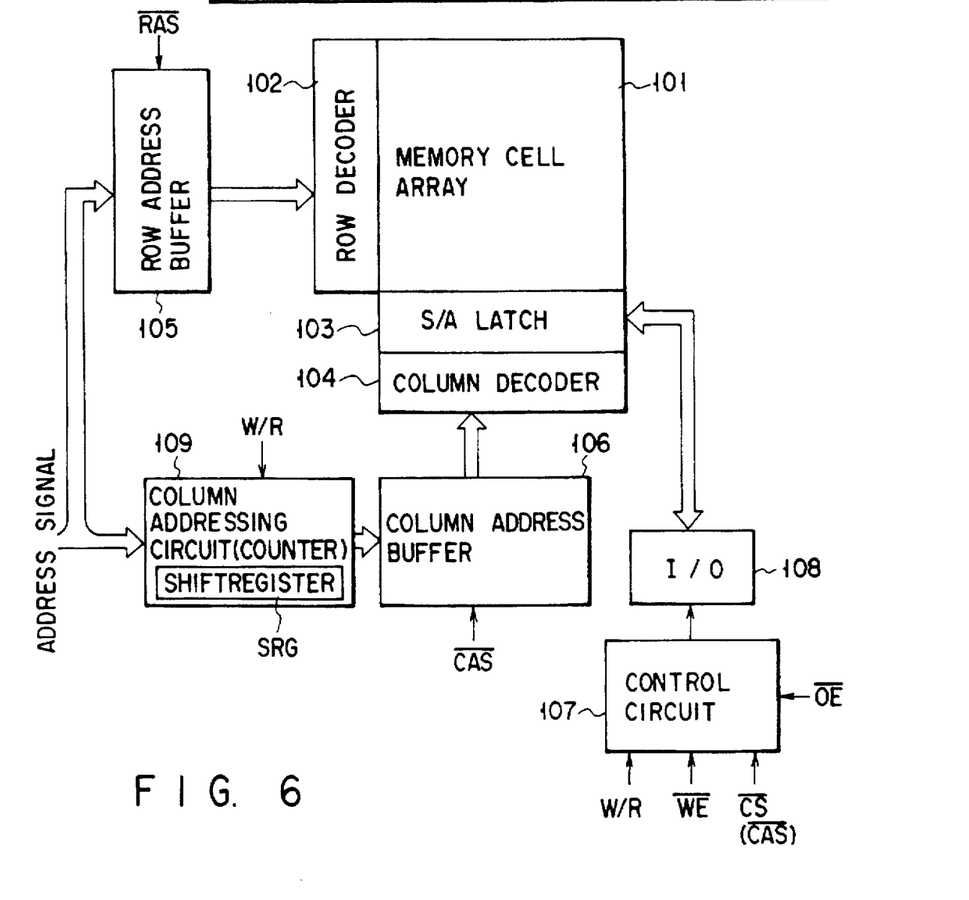
FIG. 6 is a block diagram showing a main section of a DRAM according to an embodiment of the present invention.

FIG. 6 is a block diagram showing an arrangement of a major section of a dynamic RAM (DRAM) according to an embodiment of the present invention. A memory cell array 101 is comprised of a plurality of memory cells for storing data. A row decoder 102, sense amplifier 103 and column decoder 104 constitute a memory core section, the row decoder 102 being connected to a row address buffer 105 for receiving a signal $\overline{RAS}$ (a fall signal of RAS) and the sense amplifier latch 103 and column decoder 104 being connected to a column address buffer for receiving a signal $\overline{CAS}$ (a fall signal of CAS), so that data is, for example, read from, and written to the memory cell, or refreshed, etc., by addresses from the row address buffer 105 and column address buffer 106. A control circuit 107 receives a write enable signal $\overline{WE}$, output enable signal $\overline{OE}$, write/read command signal W/R, etc., and controls an I/O circuit 108 with respect to the input/output of the data. A column addressing circuit 109 is provided at a preceding stage of the column address buffer 106 and receives an address signal and write/read command signal from an outside.

The above-mentioned arrangement is characterized in that, in the column addressing circuit 109, the wrapping of signals corresponding to a predetermined column portion is achieved. That is, a portion of the column addressing circuit 109 constituting an ordinary counter is comprised of a shift register SRG, this being a circuit arrangement very convenient to the wrapping of the address signals. The shift register SRG receives a write/read command signal and tap address signals A0EXT and A1EXT in the address signal and controls an address signal wrapping system.

Figure 7:
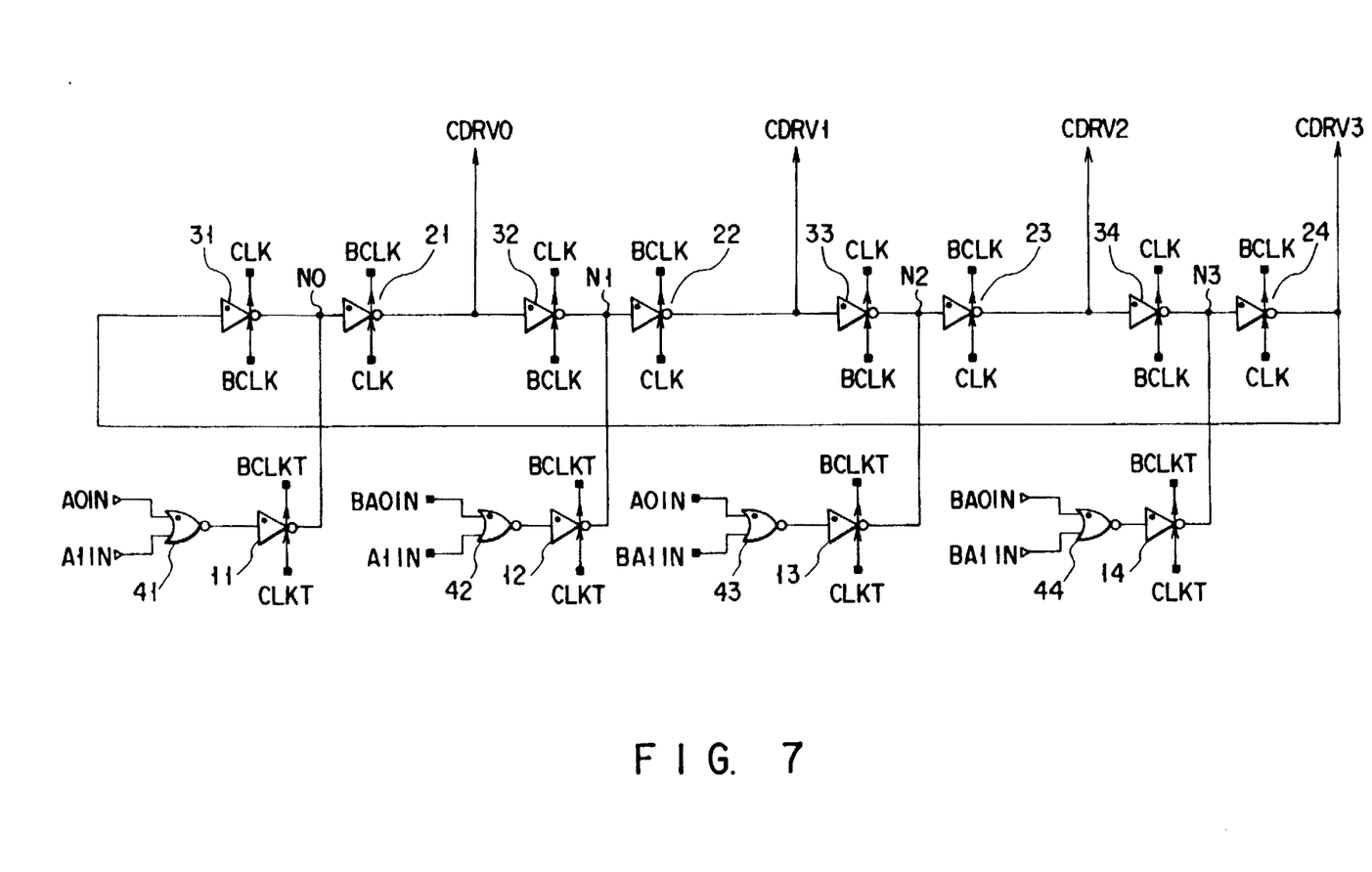
FIG. 7 shows a basic circuit diagram applied to a shift register in an addressing circuit in FIG. 6.
Figure 8:
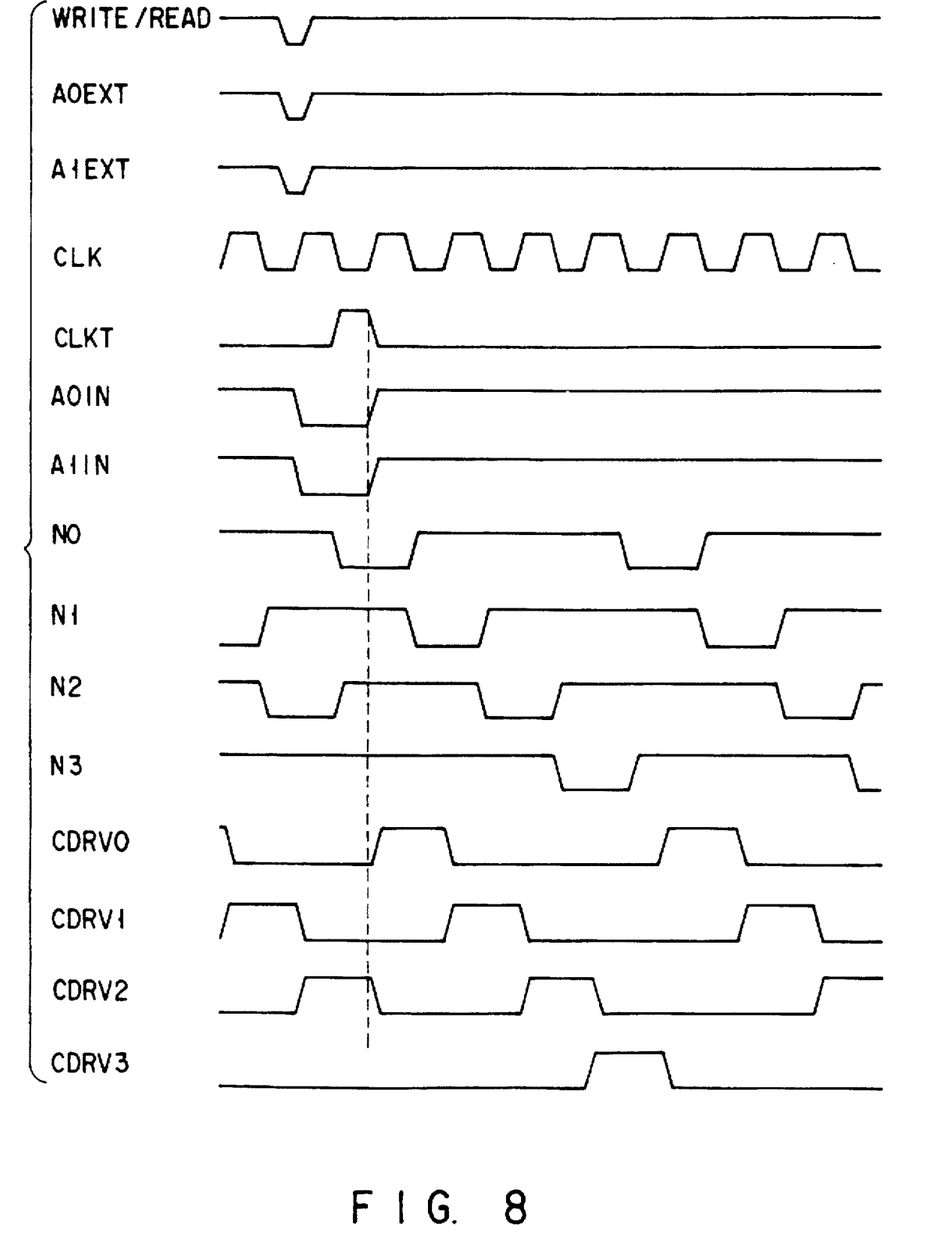
FIG. 8 is an operation waveform diagram for explaining the circuit operation in FIG. 7.

FIG. 7 shows a basic circuit diagram applied to the shift register SRG in the addressing circuit 109 of FIG. 6. FIG. 8 shows an operation waveform diagram of the FIG. 7 circuit. A signal A0IN represents an internal address signal corresponding to the tap address signal A0EXT and a signal A1IN, an internal address signal corresponding to the tap address signal A1EXT. Clocked inverters 11 to 14 become active upon receipt of a signal CLKT which rises and falls from a fall state and rise state at the next time after the write/read command signal is received. Clocked inverters 21 to 24 become active upon receipt of a clock signal CLK. Clocked inverters 31 to 34 become active upon receipt of a clock signal BCLK (an inverted signal of CLK). The clocked inverters 31 to 34 are internally so controlled that they become inactive, irrespective of any signal BCLK, upon receipt of a signal CLKT pulse. These clocked inverters 31, 21, 32, 22, 33, 23, 34, 24 are sequentially connected in a serial array and the output of the clocked inverter 24 is connected to the input of the clocked inverter 31.

In FIG. 7, the output of an NOR gate 41 for receiving internal address signals A0IN and A1IN as two inputs is connected to the input of the clocked inverter 11. The output of the clocked inverter 11 is connected to a connection node N0 of the clocked inverters 31 and 21. A column drive signal CDRV0 is obtained from a connection point between the clocked inverters 21 and 32. The output of a NOR gate 42 for receiving internal address signals BA0IN (an inverted signal of A0IN) and A1IN is connected to the input of the clocked inverter 12. The output of the clocked inverter 12 is connected to the connection node N1 between the clocked inverters 32 and 22. A column drive signal CDRV1 is obtained from a connection point between the clocked inverters 22 and 33. The output of a NOR gate 43 for receiving the internal address signals A0IN and BA1IN (an inverted signal of A1IN) as two inputs is connected to the input of the clocked inverter 13. The output of the clocked inverter 13 is connected to a connection node N2 between the clocked inverters 33 and 23. A column drive signal CDRV2 is obtained from a connection point between the clocked inverters 23 and 34. The output of a NOR gate 44 for receiving inverter address signals BA0IN and BA1IN as two inputs is connected to the input of the clocked inverter 14. The output of the clocked inverter 14 is connected to a connection node N3 between the clocked inverters 34 and 24. A column drive signal CDRV3 is obtained from a connection point between the clocked inverters 24 and 31.

The operation of a circuit of FIG. 7 will be explained below with reference to FIG. 8. When the read/write command and tap address signals A0EXT and A1EXT are input to the circuit, the clocked inverters 11 to 14 become active upon receipt of the internal address signals A0IN, A1IN and signal CLKT corresponding to the signals A0EXT and A1EXT. And in accordance with the signals A0IN and A1IN, one of nodes N0 to N3 is initialized to the "L" level and the other three nodes to the "H" levels. At this time, since the clocked inverters 31 to 34 become inactive upon the emergence of a signal CLKT pulse, the data from the preceding stage is stopped from being transferred. At the next initial clock CLK, the clocked inverters 21 to 24 become active and the data is transferred. And one of those column drive signals CDRV0 to CDRV3 becomes an "H" level and the other three "L" levels. Thereafter, the "H" level is transferred, for each clock CLK, in accordance with the serial wrapping of CDRV (0→1→2→3).

According to the arrangement as set out above, the addressing operation is carried out through the transfer of the data in the shift register so that the circuit arrangement becomes simpler. Since there are less stages of elements from the clock CLK to the column drive signal CDRV, the delay time is reduced and the high-speed unit is obtained. Further, it is not necessary to provide a circuit for stopping a carrier to an upper position upon the wrapping of the address signal. For example, it is possible to achieve the column addressing of the lower two bits with such a circuit arrangement.

Next, explanation will be given below about a practical circuit for readily applying the present invention to two addressing modes (the sequence mode and interleaving mode as shown in FIG. 5) of the synchronous DRAM.

Figure 9:
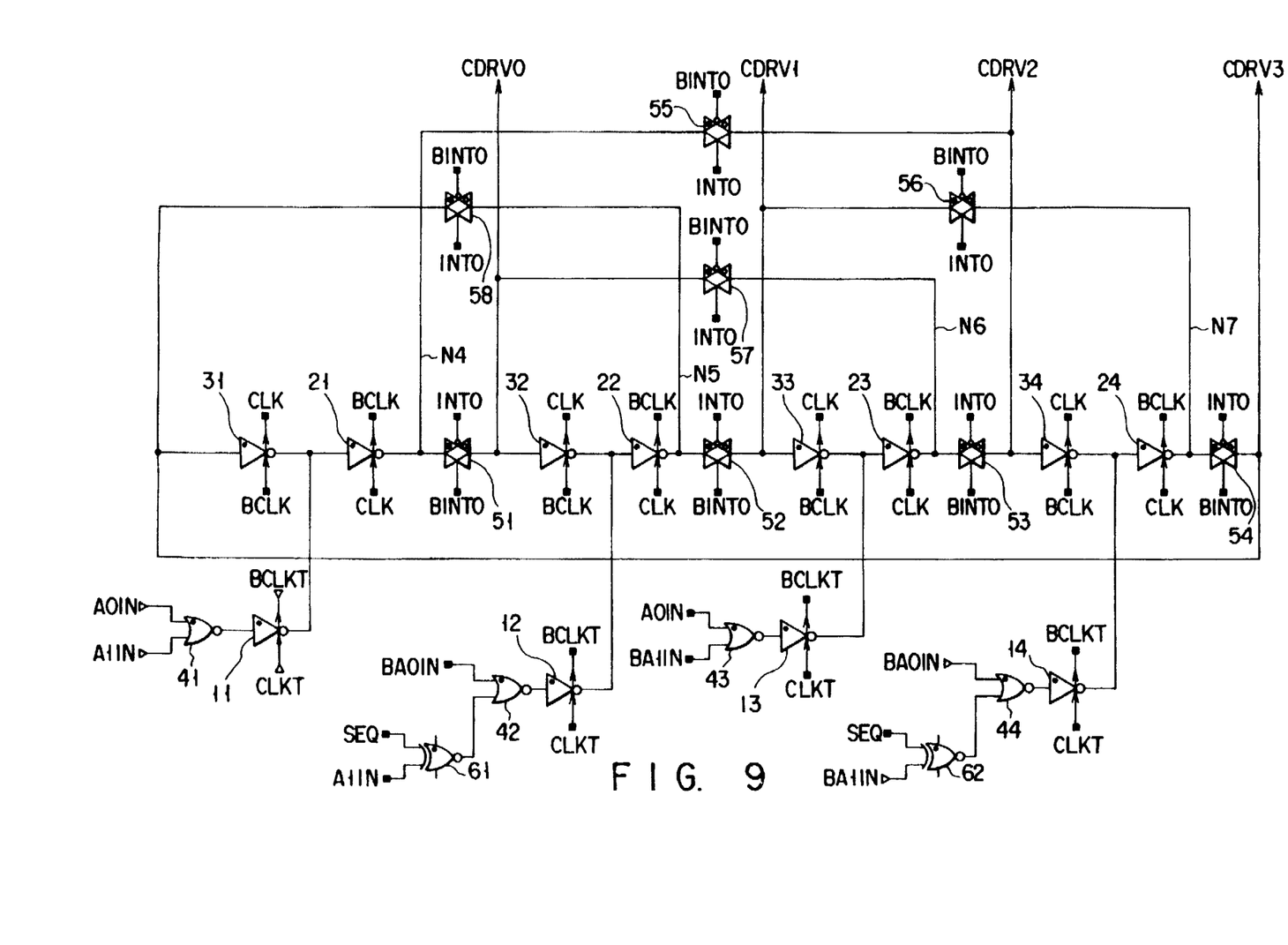
FIG. 9 is a circuit diagram showing a shift register arrangement applied to a shift register in an addressing circuit in FIG. 6 and capable of varying a shift direction in a corresponding addressing mode.

FIG. 9 is a circuit diagram showing the arrangement of a shift register applied to the shift register SRG in the addressing circuit 109 in FIG. 6 and variable by the addressing mode in a shift direction. In the synchronous DRAM, the column address is decremented, in the interleaving mode, at A0IN=1, whereas, in the circuit of FIG. 9, this addressing is realized through the reverse rotation of the shift register.

Explanation will be given about the circuit arrangement of FIG. 9 in conjunction with the portion different from that in the arrangement of FIG. 7. A transfer gate 51 is provided at a node N4 between the output of the clocked inverter 21 and the output of a signal CDRV0 to effect ON control. A transfer gate 52 is provided at a node N5 between the output of a clocked inverter 22 and the output of a signal CDRV1 to effect ON control. A transfer gate 53 is provided at a node N6 between the output of a clocked inverter 23 and the output of a signal CDRV2 to effect ON control. A transfer gate 54 is provided at a node N7 between the output of the clocked inverter 24 and the output of a signal CDRV3 to effect ON control. A transfer gate 55 is provided between the node N4 and the output of the signal CDRV2 to effect ON control. A transfer gate 56 is provided between the node N7 and the output of the signal CDRV1 to effect ON control. A transfer gate 57 is provided between the node N6 and the output of the signal CDRV0 to effect ON control. A transfer gate 58 is provided between the node N5 and the output of the signal CDRV3 to effect ON control. A pair of control signals INT0, BINT0 are complementary signals, noting that "B" in BINT0 is intended to mean an inverted signal. The transfer gates 51 to 54 are turned ON when a control signal INT0 is at a "L" level (control signal BINT0 is at a "H" level) and are turned OFF when there arises a reverse signal relation. The transfer gates 55 to 58 are turned ON when the control signal BINT0 is at a "L" level (INT0 is at a "H" level) and are turned OFF when there arises a reverse signal relation.

One input terminal of a NOR gate 42 is connected to the output of an EXNOR gate 61. The EXNOR gate 61 are supplied, at their two inputs, with a signal A1IN and mode setting signal SEQ. The one-input side of the NOR gate 44 is connected to the output of the EXNOR gate 62. The EXNOR gate 62 are supplied, at their two inputs, with a signal BA1IN and mode setting signal SEQ. Here, the signal SEQ becomes the "H" level for a sequential mode and the "L" level for an interleaving mode.

Figure 10:
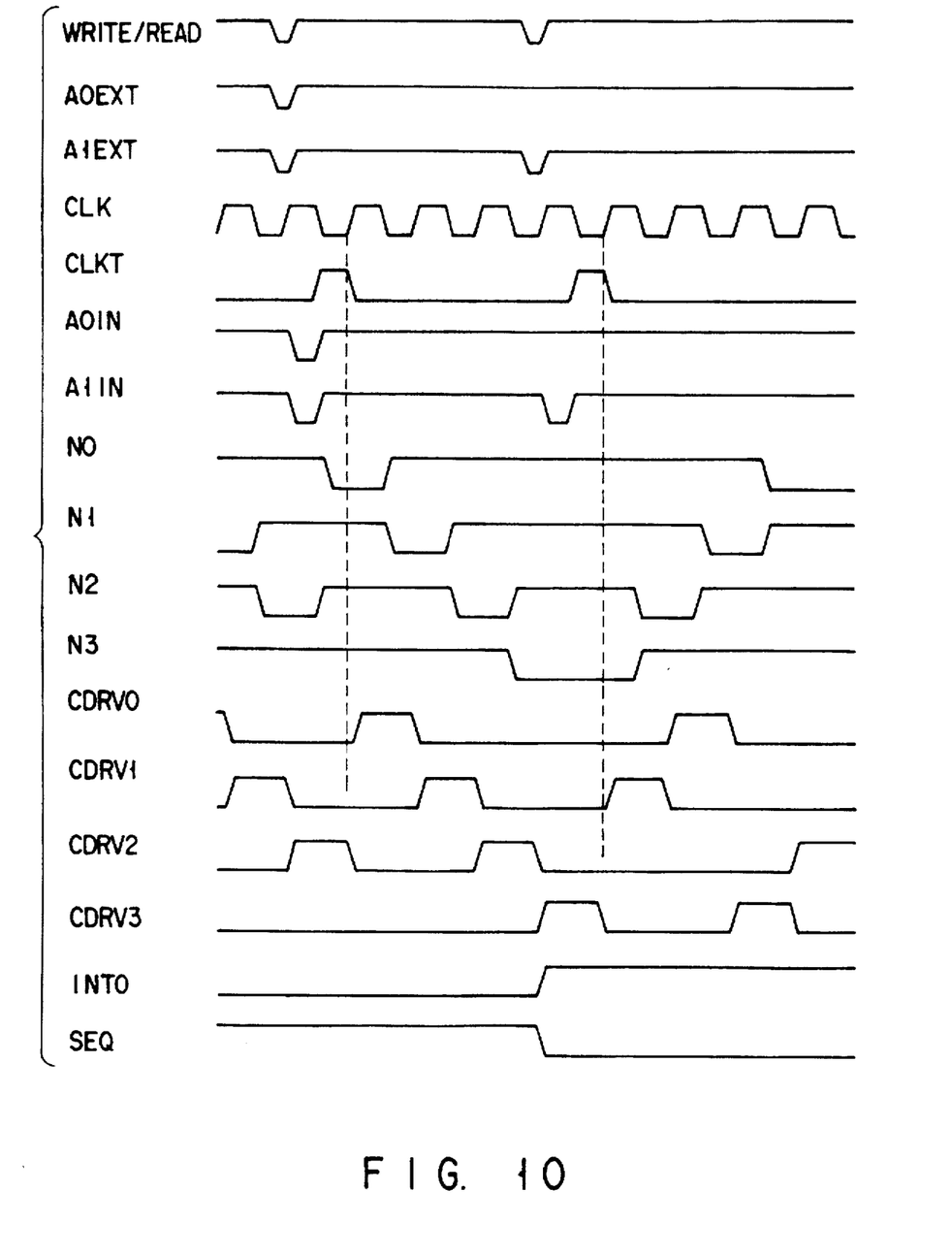
FIG. 10 is an operation waveform diagram for explaining an interleaving mode in FIG. 9.

FIG. 10 shows an operation waveform diagram for explaining an interleaving mode in FIG. 9. When an address is decremented, the transfer gates 51 to 54 are turned OFF with the control signal INT0 at the "H" level, whereas the transfer gates 55 to 58 are turned ON, so that the data transfer path is switched to a reverse shift sequence. That is, the nodes N0 TO N3 are each initialized both with the signals A0IN and A1IN corresponding to the tap address and with the setting of the shift direction of the shift register by the mode setting. Here, for the sequential mode, the column drive signals have their "H" levels transferred, as the CDRV (0→1→2→3), at respective clocks CLK on the basis of serial wrapping whereas, for the interleaving mode, the column drive signals have their "H" levels transferred, as CDRV (3→2→1→0), at respective clocks on the basis of reverse serial wrapping.

According to the circuit arrangement, even if the address select mode, such as the interleaving mode, is involved, addressing can be done through the data transfer in the register. For this reason, in comparison with the FIG. 3 conventional arrangement using a counter, the number of stages of elements from the clock CLK to the column drive signals CDRV can be reduced. Further, the control signals can also be reduced and simplified. As a result, the addressing circuit can be simplified for column address in the synchronous DRAM and hence a high-speed operation can be expected.

Figure 11:
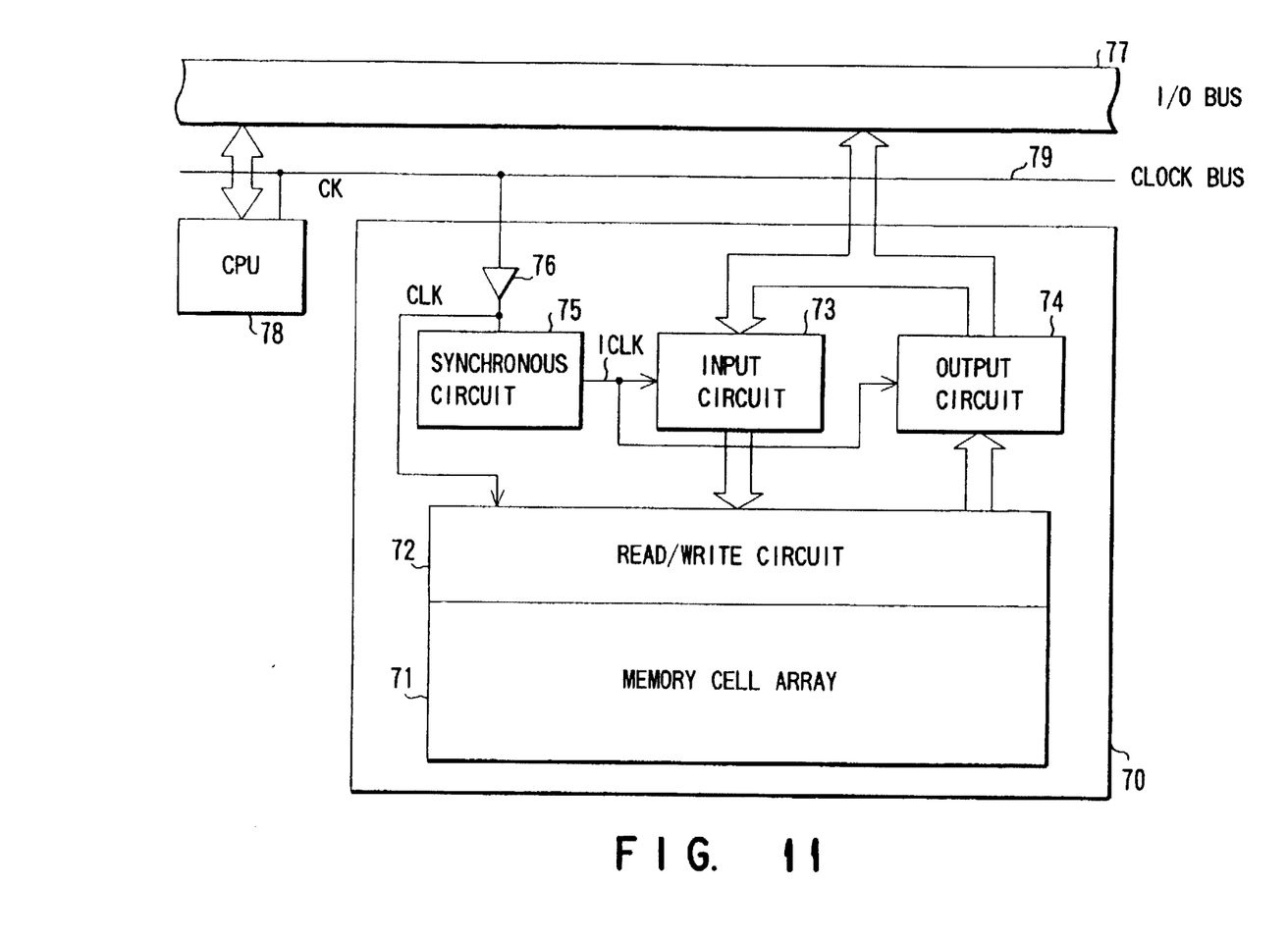
FIG. 11 is a circuit diagram showing one example of a memory system according to the present invention.

FIG. 11 is a circuit diagram showing one example of a memory system according to the present invention. A memory chip 70 in the system comprises a memory cell array 71, read/write circuit 72, input circuit 73, output circuit 74, synchronous circuit 75 and clock buffer 76. A chip CPU 78 delivers a clck signal CK, the clock signal CK is supplied via a clock bus 79 to the memory chip 70 where it becomes a clock signal CLK. In the memory ship 70, the clock signal CLK is supplied to a read/write circuit 72. The read/write circuit 72 is operated in synchronism with a clock signal CLK. The read/write circuit 72 includes a decode-system circuit necessary for data readout and program, sensing-system circuit, etc., as well as an addressing circuit with a shift register configuration shown in FIG. 9 as set out above. Any skew between the clock signals CK and CLK is eliminated by a synchronous circuit 75. The synchronous circuit 75 delivers a clock signal ICLK. The clock signal ICLK is supplied to the input circuit 73 and output circuit 74. The input circuit 73 and output circuit 74 is operated in synchronism with the clock signal ICLK. An I/O bus 77 connects the memory chip 70 to the chip CPU 78. The data is transferred, by the I/O bus 77, between the memory chip 70 and the chip CPU 78.

According to the present invention, for not only the addressing circuit for column addresses in the synchronous DRAM but also a serial access system for, for example, a flash memory, if any desired address signal wrapping system is created with the shift register arrangement of FIG. 7 as a basis, it is possible to obtain the same advantage as set out above.

According to he present invention, as already set out above, the wrapping system of predetermined address signals are created with the shift register arrangement as a basis and, by doing so, the count-up of the address signal is connected directly to the data shift transfer to provide a corresponding output signal. It is, therefore, possible to provide a semiconductor memory circuit with the addressing circuit embodied as a simplified, high-speed unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A memory circuit having an address select mode and adapted to access a predetermined column portion, comprising:
a memory cell array having a plurality of memory cells;
means for designating an address signal corresponding to a head address for accessing a predetermined column portion of the memory cell array in synchronism with a clock signal; and
internal address signal generating means including a shift register for allowing access to the predetermined column portion in a corresponding address select mode from an address in synchronism with the clock signal.

2. The memory circuit according to claim 1, wherein the shift register selects one shift direction of forward and reverse shift directions by a signal corresponding to a result of a logical combination of the address signal and a signal for setting the address select mode and generates the address signal corresponding to the access of the predetermined column portion by a corresponding shift operation.

3. The memory circuit according to claim 1, wherein the shift register includes transfer control circuit means in portions of a shift path, the shift path being created, by ON-control of the transfer control circuit means, in accordance with the address select mode.

4. The memory circuit according to claim 1, wherein the shift register comprises a series-input parallel-output type right/left shift register having a closed loop shift path, transfer control circuit means being provided in portions of the shift path, and the shift path being created in accordance with transfer control.

5. The memory circuit according to claim 1, wherein the memory circuit is of a synchronous DRAM type and the internal address signal generating means performs the function to allow a burst access operation of the synchronous DRAM.

6. The memory circuit according to claim 5, wherein the internal address signal generating means has, in the burst access operation, at least two kinds of address select modes as sequential and interleaving modes for wrapping the addresses.

7. The memory circuit according to claim 1, further comprises a chip CPU for controlling a generation of the clock signal, a clock bus for transferring the clock signal, and an I/O bus for allowing transfer of data for access to the memory circuit.

8. A memory circuit having at least one kind of address select mode for a burst operation and adapted to effect burst access synchronized with a clock signal in accordance with the address select mode, comprising:
a memory cell array having a plurality of memory cells;
means for designating an address signal corresponding to a head address for effecting burst access to the memory array; and
an internal address signal generating circuit including a shift register for allowing burst access in a corresponding address select mode from the address in synchronism with the clock signal.

9. The memory circuit according to claim 8, wherein the shift register selects one shift direction of forward and reverse shift directions by a signal corresponding to a result of a logical combination of the address signal and a signal for setting the address select mode and generates the address signal corresponding to the access of predetermined column portion by a corresponding shift operation.

10. The memory circuit according to claim 8, wherein the shift register has transfer control circuit means in portions of a shift path, the shift path being created, by ON-control of the transfer control circuit means, in accordance with the address select mode.

11. The memory circuit according to claim 8, wherein the memory circuit is of a synchronous DRAM and the internal address signal generating circuit performs the function to allow a burst access operation of the synchronous DRAM.

12. The memory circuit according to claim 8, wherein the internal address signal generating circuit has at least two kinds of address select modes as sequential and interleaving modes for wrapping the address.

13. A semiconductor memory circuit comprising:
a memory cell array having a plurality of memory cells;
means for designating an address signal corresponding to a head address for accessing a predetermined column portion of the memory cell array in synchronism with a clock signal; and
internal address signal generating means including a shift register for allowing access to the predetermined column portion from an address in synchronism with the clock signal, the shift register having a transfer control circuit at a portion of the shift path;
wherein the shift register comprises a series-input parallels-output type right/left shift register having a closed shift path whereby the shift path is controlled under the transfer control circuit.

14. The memory circuit according to claim 13, wherein the memory circuit is comprised of a synchronous DRAM using a burst access operation and the internal address signal generating means has at least two kinds of address select modes as sequential and interleaving modes for wrapping the address.

15. A memory system having an address select mode and having a memory circuit for gaining access to a predetermined column portion in the address select mode, comprising:

a chip CPU for controlling a generation of a clock signal;

a clock bus for transferring the clock signal;

a memory chip including:
   a memory cell array having a plurality of memory cells,
   means for designating an address signal corresponding to a head address for accessing a predetermined column portion of the memory cell array in synchronism with the clock signal, and
   internal address signal generating means including a shift register for allowing access to the predetermined column portion in a corresponding address select mode from an address in synchronism with the clock signal; and an I/O bus for transferring data for access to the memory chip, the I/O bus serving as a data transfer path to the chip CPU.

16. A memory system having at least one kind of an address select mode for burst operation and having a memory circuit for burst access in the address select mode in synchronism with a clock signal, comprising:

a chip CPU for delivering the clock signal;

a clock bus for transferring the clock signal;

a memory chip including:
   a memory cell array having a plurality of memory cells for storing data,
   means for designating an address signal corresponding to a head address for effecting burst access to the memory array, and
   an internal address signal generating circuit including a shift register for allowing burst access in a corresponding address select mode from the address in synchronism with the clock signal; and an I/O bus for allowing transfer of data for access to the memory chip, the I/O bus serving as a data transfer path to the CPU.

17. A data transfer system for a memory circuit, comprising:

a chip CPU for delivering a clock signal;

a clock bus for transferring the clock signal;

a memory chip including:
   a memory cell array having a plurality of memory cells,
   means for designating an address signal corresponding to a head address for accessing a predetermined column portion of the memory cell array in synchronism with the clock signal, and
   internal address signal generating means including a shift register for allowing access to the predetermined column portion from an address in synchronism with the clock signal, the shift register having a transfer control circuit at a portion of the shift path, wherein the shift register comprises a series-input parallel-output type right/left shift register having a closed shift path whereby the shift path is controlled under the transfer control circuit; and an I/O bus for allowing transfer of data for access to the memory chip, the I/O bus serving as a data transfer path to the chip CPU.

* * * * *